(12) United States Patent
Tang et al.

(10) Patent No.: US 11,058,000 B1
(45) Date of Patent: Jul. 6, 2021

(54) FLEXIBLE DISPLAY DEVICE

(71) Applicant: WuHan TianMa Micro-electronics CO., LTD., Wuhan (CN)

(72) Inventors: Shunqi Tang, Wuhan (CN); Congyi Su, Wuhan (CN); Jian Jin, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 0 days.

(21) Appl. No.: 16/827,165

(22) Filed: Mar. 23, 2020

(30) Foreign Application Priority Data

Jan. 2, 2020 (CN) .......................... 202010002896.2

(51) Int. Cl.
| | |
|---|---|
| *H05K 1/14* | (2006.01) |
| *H05K 5/00* | (2006.01) |
| *H05K 5/02* | (2006.01) |

(52) U.S. Cl.
CPC ........... *H05K 1/147* (2013.01); *H05K 5/0017* (2013.01); *H05K 5/0217* (2013.01); *H05K 2201/10128* (2013.01)

(58) Field of Classification Search
CPC ..................................................... H05K 1/147
USPC ......................................................... 361/749
See application file for complete search history.

(56) References Cited

U.S. PATENT DOCUMENTS

| | | | | |
|---|---|---|---|---|
| 2020/0170114 A1* | 5/2020 | Choi | ....................... | G09F 9/301 |
| 2021/0007230 A1* | 1/2021 | Kang | ....................... | H05K 5/03 |

FOREIGN PATENT DOCUMENTS

| | | |
|---|---|---|
| CN | 106409147 A | 2/2017 |
| CN | 107358872 A | 11/2017 |
| CN | 109326214 A | 2/2019 |

\* cited by examiner

*Primary Examiner* — Stanley Tso
(74) *Attorney, Agent, or Firm* — Christensen O'Connor Johnson Kindness PLLC

(57) ABSTRACT

The present disclosure provides a flexible display device including a flexible display panel, a flexible printed circuit board, and a reel. The flexible printed circuit board includes a first binding area provided with a first pad and an element area provided with an integrated circuit. The flexible display panel includes a display area, and a second binding area provided with a second pad. The first pad is bound to the second pad. The reel has a cavity, and the reel includes an inner surface facing towards the cavity and an outer surface facing away from the cavity. The inner surface includes a first surface, and the first surface is flat. The element area of the flexible printed circuit board is provided on the first surface, and the display area of the flexible display panel is rollable along the outer surface of the reel.

18 Claims, 8 Drawing Sheets

FLEXIBLE DISPLAY DEVICE

CROSS-REFERENCE TO RELATED APPLICATIONS

The present application claims priority to Chinese Patent Application No. 202010002896.2, filed on Jan. 2, 2020, the content of which is incorporated herein by reference in its entirety.

TECHNICAL FIELD

The present disclosure relates to the field of display technology, and in particular, to a flexible display device.

BACKGROUND

With the rapid development of portable electronic terminal equipment, flexible display devices have attracted more and more attention of consumers and researchers in the field of display technology. The flexible display devices are able to be bent freely like paper due to its bendability, while performing a complete screen display.

At present, the flexible display devices can be classified into foldable flexible display devices and rollable flexible display devices according to different bending manners. The rollable flexible display device has a relatively large screen ratio when being deployed and has a smaller area for carrying after being rolled. Therefore, it becomes a current research focus.

However, in order to adapt to development trend of narrow frames of display devices, many display panels are bound to flexible printed circuit boards. Since various electronic elements are arranged on the flexible printed circuit board, if a size of the rolled flexible display device is required to be smaller, it is technically difficult to guarantee the reliability of the electronic elements in presence of the flexible printed circuit board.

SUMMARY

In view of the above, an embodiment of the present disclosure provides a flexible display device, in order to solve the above problems.

The flexible display device provided in the present disclosure includes a flexible display panel, a flexible printed circuit board, and a reel. The flexible printed circuit board comprises a first binding area and an element area, an integrated circuit is provided in the element area, and a first pad is provided in the first binding area. The flexible display panel comprises a display area and a second binding area, a second pad is provided in the second binding area, and the first pad of the first binding area is bound to the second pad of the second binding area. The reel has a structure of a cavity, and the reel comprises an inner surface facing towards the cavity and an outer surface facing away from the cavity, the inner surface comprises a first surface, and the first surface is a flat surface. The element area of the flexible printed circuit board is provided on the first surface, and the display area of the flexible display panel is rollable along the outer surface of the reel.

BRIEF DESCRIPTION OF DRAWINGS

In order to more clearly illustrate technical solutions of embodiments of the present disclosure, the accompanying drawings used in the embodiments are briefly described below. The drawings described below merely illustrate parts of embodiments of the present disclosure.

DESCRIPTION OF EMBODIMENTS

In order to better understand technical solutions of the present disclosure, the embodiments of the present disclosure are described in details with reference to the drawings.

It should be clear that the described embodiments are merely parts of, rather than all of the embodiments of the present disclosure.

The terms used in the embodiments of the present disclosure are for the purpose of describing particular embodiments and not intended to limit the present disclosure. Unless otherwise noted in the context, the singular form terms such as "a", "an", "the" and "said" used in the embodiments and appended claims of the present disclosure are also intended to represent a plural form.

It should be understood that the term "and/or" used herein is intended to describe relations of the associated objects, and indicates three possible relations. For example, A and/or B may indicate that only A exists; A and B exist concurrently; and only B exists. In addition, a character "/" herein generally indicates that the contextual objects are in an "or" relationship.

In the present disclosure, it should be understood that terms "basically", "approximately", "around", "about", "generally", and "substantially" in the claims and embodiments of the present disclosure indicates that the values are generally recognized within a reasonable range of process operation or tolerance, rather than accurate values.

It should be understood that terms such as "first", "second", "third", etc., which may be used in the embodiments of the present disclosure to describe binding areas, pads, and the like, are not intended to limit these binding areas, pads, and the like. The terms are used to distinguish the binding areas, pads, and the like from each other. For example, without departing from the scope of the embodiments of the present disclosure, a first binding area may also be referred to as a second binding area, and similarly, a second binding area may also be referred to as a first binding area.

Applicant of the present application, through careful and in-depth research, provides a solution to the problems in the related art.

Figure 1:
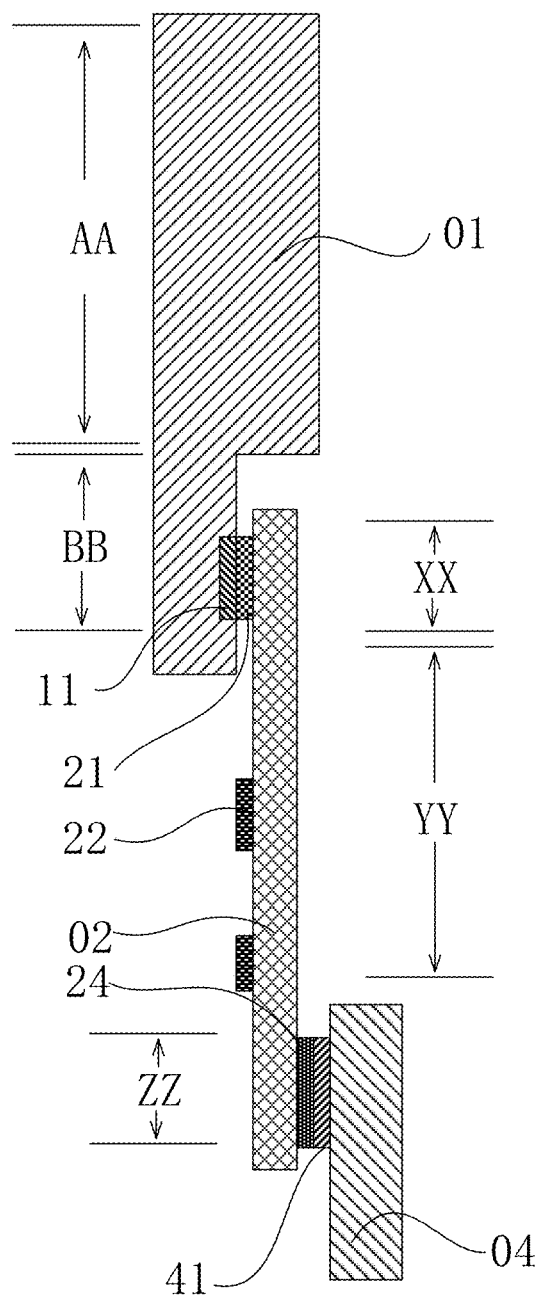
FIG. 1 is a schematic diagram of a flexible display screen provided in an embodiment of the present disclosure.
Figure 2:
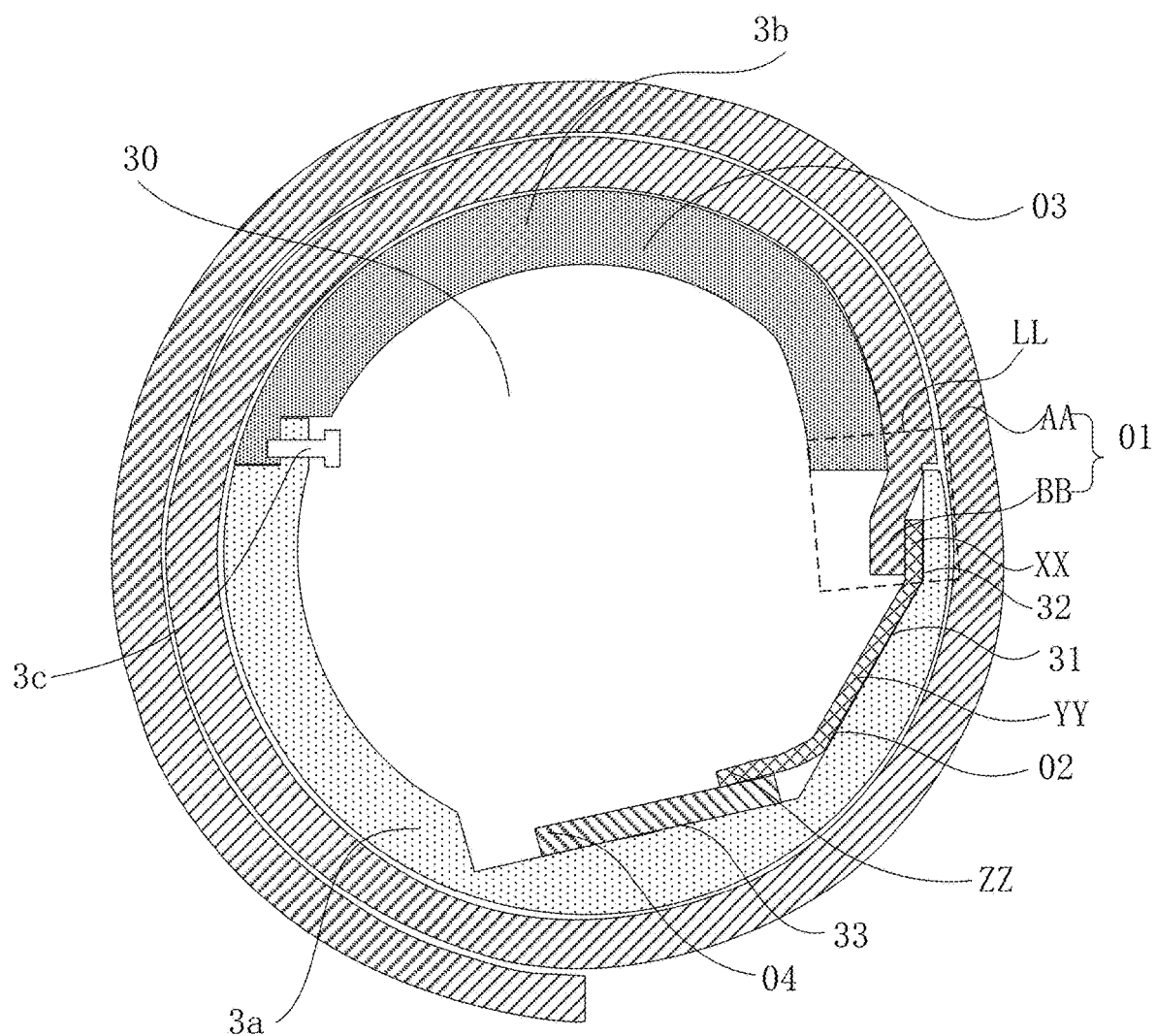
FIG. 2 is a schematic diagram of a rolled flexible display device provided in an embodiment of the present disclosure.
Figure 3:
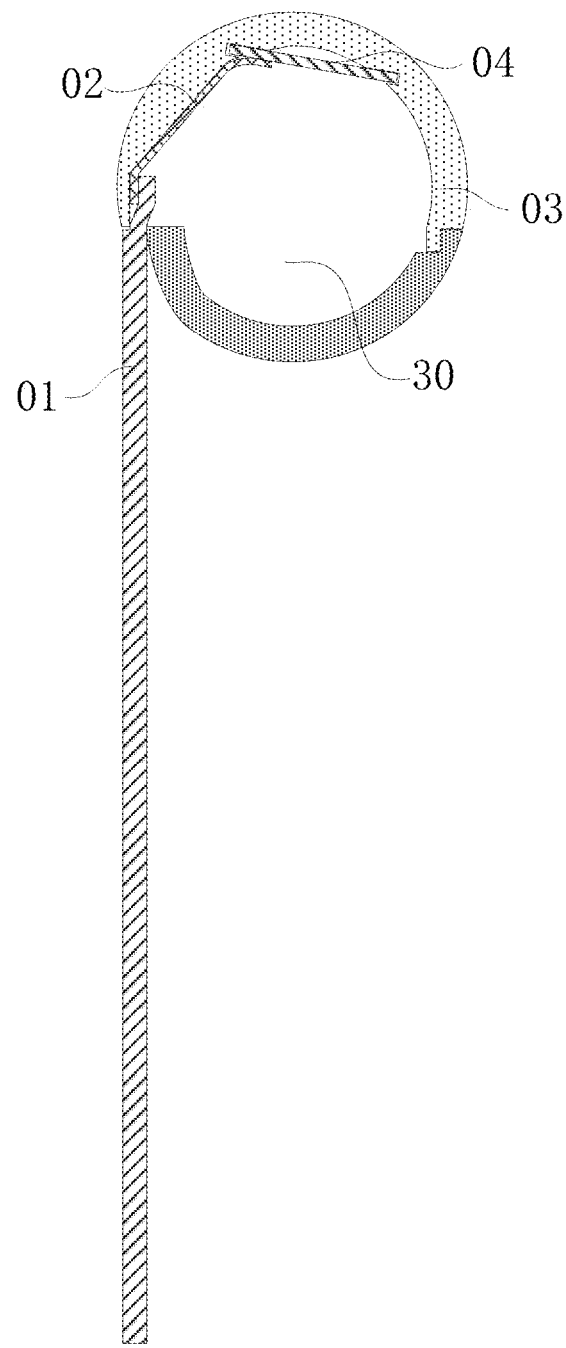
FIG. 3 is a schematic diagram of an unrolled flexible display device provided in an embodiment of the present disclosure.

FIG. 1 is a schematic diagram of a flexible display screen provided in an embodiment of the present disclosure, FIG. 2 is a schematic diagram of a rolled flexible display device provided in an embodiment of the present disclosure, and FIG. 3 is a schematic diagram of an unrolled flexible display device provided in an embodiment of the present disclosure. As shown in FIG. 2 and FIG. 3, the flexible display device provided by the embodiment of the present disclosure includes a flexible display panel 01, a flexible printed circuit board 02, and a reel 03. As shown in FIG. 2, a partial region of the flexible display panel 01 may be rolled along an outer surface of the reel 03. As shown in FIG. 3, the partial region of the flexible display panel 01 may be unrolled from the outer surface of the reel 03.

Referring to FIG. 1 and FIG. 2, the flexible printed circuit board 02 includes a first binding area XX and an element area YY. The first binding area XX is provided with a first pad 21, and the element area YY is provided with an integrated circuit 22. In addition, the element area YY may further be provided with electronic elements such as a capacitor, a resistor, a diode, and a transistor. The flexible display panel 01 has a display area AA and a second binding area BB. The display area AA is a region for the display of the flexible display panel 01, and the second binding area BB is provided with a second pad 11. The first pad 21 provided in the first binding area XX of the flexible printed circuit board 02 is bound to the second pad 11 provided in the second binding area BB of the flexible display panel 01.

Referring to FIG. 2 and FIG. 3, the reel 03 has a hollow cavity. For example, the reel 03 includes an inner surface facing towards a cavity 30 and an outer surface facing away from the cavity. The cavity of the reel 03 is configured to receive structures outside the display area AA of the flexible display panel 01 such as a mainboard 04, a power supply, a gear, and a motor. The inner surface of the reel 03 includes a first surface 31, and the first surface 31 is a planar structure.

Referring to FIG. 2, for example, the display area AA of the flexible display panel 01 can be rolled along the outer surface of the reel 03. For example, the element area YY of the flexible printed circuit board 02 is located on the first surface 31 of the reel 03.

The element area YY, where the integrated circuit 22 is provided, of the flexible printed circuit board 02 is located on the first surface 31 of the reel 03, and the first surface 31 is a planar structure. Thus, the element area YY of the flexible printed circuit board 02 is provided on a planar surface. With such a design, the structures of the integrated circuit 22 and other electronic elements in the element area YY are not affected, and in the meantime, the integrated circuit 22 is securely fixed to other electronic elements.

Further, referring to FIG. 2 and FIG. 3, the outer surface of the reel 03 is a curved surface. That is, the display area AA of the flexible display panel 01 rolled along the outer surface of the reel 03 is actually rolled along a curved surface. Thus, the display area AA of the flexible display panel 01 can be relatively gently rolled, to ensure reliability of the circuits and wirings in the display area AA. In addition, since the element area YY of the flexible printed circuit board 02 is provided on the inner surface of the reel 03, the element area YY does not occupy too much space of the cavity 30 of the reel 03, and a larger space of the cavity can be provided for other devices.

In addition, the element area YY of the flexible printed circuit board 02 is required to be fixed on the first surface 31 of the reel 03. For example, the element area YY can be fixed on the first surface 31 by an adhesive tape, and the fixing is relatively performed by a simple method and easy to maintain. It is also possible to adopt other fixing methods, such as glue binding, screw locking and the like.

In an embodiment of the present disclosure, further referring to FIG. 2, the inner surface of the reel 03 further includes a second surface 32, and the second surface 32 is connected to the first surface 31. That is, the inner surface of the reel 03 includes the first surface 31 and the second surface 32 that are adjacently provided. Moreover, the first binding area XX of the flexible printed circuit board 02 and the second binding area BB of the flexible display panel 01 are provided on the second surface 32. As the second binding area BB of the flexible display panel 01 is provided on the second surface 32, i.e., the second binding area BB of the flexible display panel 01 is also provided in the cavity 30 of the reel 03, a screen ratio of the flexible display panel 01 provided outside the cavity 30 of the reel 03 is increased, thereby improving viewing experience. In addition, the element area YY of the flexible printed circuit board 02 bound to the second binding area BB of the flexible display panel 01 is usually adjoint to the first binding area XX of the flexible printed circuit board 02. Therefore, it is process simple and easy to operate when the first binding area XX is provided on the first surface 31, and the second binding area YY connected thereto is provided on the second surface 32 adjacent to the first surface 31.

In addition, with reference to FIG. 2, the first binding area XX and the second binding area BB are provided on the second surface 32, and specifically, the first binding area XX is fixed on the second surface 32, and the second binding area BB is bound to the first binding area XX. The first binding area XX can also be fixed on the second surface 32 by an adhesive tape, and this fixing can be achieved by a simple method and is easy to maintain. It is also possible to adopt other fixing methods, such as glue binding, screw locking and the like.

In an embodiment of the present disclosure, the second surface 32 of the reel 03 is also a planar structure. Since the first binding area XX and the second binding area BB that are bound to each other are provided on the second surface 32, the second surface 32 having the planar structure can guarantee that both the first pad 21 in the first binding area XX and the second pad 11 in the second binding area BB have a flat surface, thereby ensuring the firmness of the binding between the first binding area XX and the second binding area BB.

In an embodiment of the present disclosure, as shown in FIG. 2, an angle between the second surface 32 and the first surface 31 is greater than or equal to 90°. For example, since the first binding area XX and the element area YY of the flexible printed circuit board 02 are flatly provided on the second surface 32 and the first surface 31 respectively, and the angle between the second surface 32 and the first surface 31 facing towards the cavity 30 of the reel 03 is greater than or equal to 90°, the angle between the first binding area XX and the element area YY facing towards the cavity 30 of the reel 03 is also greater than or equal to 90°. In this way, a bending stress between the first binding area XX and the element area YY is reduced, thereby protecting the wirings in a bending region between the first binding area XX and the element area YY from being influenced by excessive bending stress.

It should be noted that, since the first binding area XX of the flexible printed circuit board 02 is usually provided with the first pad 21 and fan-shaped wirings rather than many other electronic elements, the second surface 32 can also be a curved structure. In this case, a tangent of respective points at a position where the second surface 32 and the first surface 31 are connected encloses an angle facing towards the cavity 30 with respect to the first surface 31, and the angle is greater than or equal to 90°.

In the embodiment of the present disclosure shown in FIG. 1 to FIG. 3, the flexible display device further includes a mainboard 04, the flexible printed circuit board 02 further includes a connection area ZZ, and the connection area ZZ of the flexible printed circuit board 02 is electrically connected to the mainboard 04. Referring to FIG. 1 to FIG. 3, one end of the flexible printed circuit board 02 is bound to the flexible display panel 01, and the opposite end is electrically connected to the mainboard 04. For example, referring to FIG. 1, the mainboard 04 includes a connector 41, the connection area ZZ of the flexible printed circuit board 02 includes a third pad 24, and the third pad 24 is connected to the connector 41.

In an embodiment of the present disclosure, the mainboard 04 is also provided in the cavity 30 of the reel 03. Due to the presence of the cavity 30 of the reel 03, the reel 03 can also provide a receiving structure for other elements of the flexible display device other than the flexible display panel 01 in addition to providing support for the rolling of the display area AA of the flexible display panel 01.

With reference to FIG. 2, in the embodiment of the present disclosure, the inner surface of the reel 03 further includes a third surface 33, and the third surface 33 is connected to the first surface 31. That is, the inner surface of the reel 03 further includes the third surface 33 adjoint to the first surface 31. The mainboard 04 is provided on the third surface 33. The connection area ZZ connected to the mainboard 04 is adjoint to the element area YY. Therefore, when the element area YY is provided on the first surface 31, the connection area ZZ adjoint to the element area YY is provided on the third surface 33 adjoint to the first surface 31, which is simple in process and easy to operate.

In an embodiment of the present disclosure, the third surface 33 of the reel 03 is also a planar structure. Since the mainboard 04 is usually a flat hard structure, the third surface 33 of the reel 03, as a planar structure, can fit with the planar hard structure of the mainboard 04, thereby facilitates the fixing of the mainboard.

In addition, with reference to FIG. 2, the connection area ZZ is provided on the third surface 33 in such a manner that the connection area ZZ is fixed to the third surface 33. The connection area ZZ can be fixed to the third surface 33 by using an adhesive tape, which can be simply implemented and maintained. It is also possible to employ other fixing methods, such as glue binding, screw locking and the like.

In the embodiment as shown in FIG. 2, the angle between the third surface 33 and the first surface 31 is greater than or equal to 90°. For example, since the connection area ZZ and the element area YY of the flexible printed circuit board 02 are flatly provided on the third surface 33 and the first surface 31 respectively, and the angle between the third surface 33 and the first surface 31 facing towards the cavity 30 of the reel 03 is greater than or equal to 90°, the angle between the connection area ZZ and the element area YY facing towards the cavity 30 of the reel 03 is greater than or equal to 90°. In this way, the bending stress between the connection area ZZ and the element area YY is reduced, thereby protecting wirings in a bending region between the connection area ZZ and the element area YY from being influenced by excessive bending stress.

Figure 4:
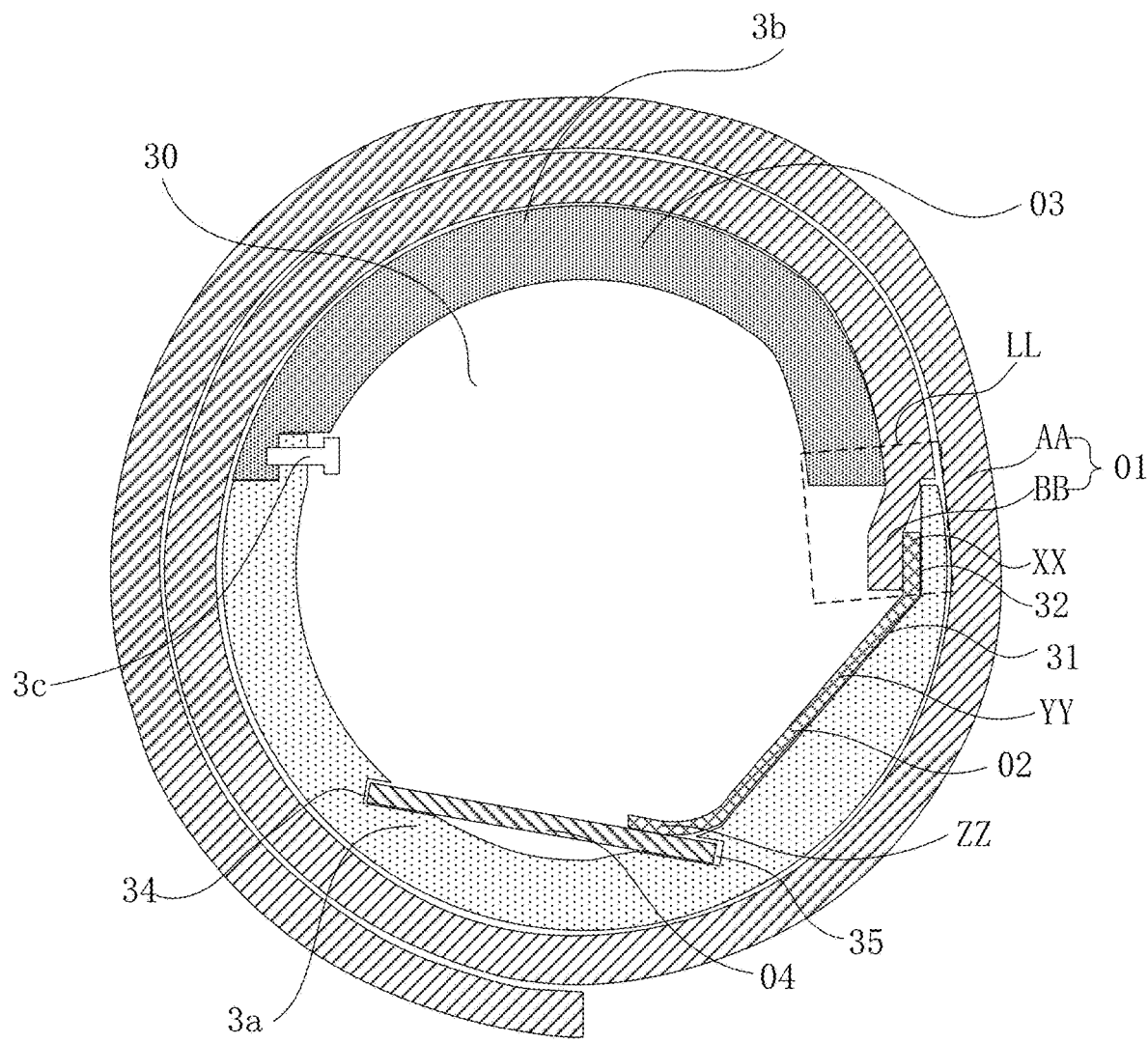
FIG. 4 is a schematic diagram of a rolled flexible display device provided in another embodiment of the present disclosure.

FIG. 4 is a schematic diagram of a rolled flexible display device provided in another embodiment of the present disclosure. As shown in FIG. 4, the reel 03 further includes a first fixing recess 34 and a second fixing recess 35, and openings of the first fixing recess 34 and the second fixing recess 35 both face towards the cavity 30 of the reel 03.

One end of the mainboard 04 is provided in the first fixing recess 34, and the other end of the mainboard 04 is provided in the second fixing recess 35. In addition, an angle between a plane of the mainboard 04 and the first surface 31 is greater than or equal to 90°. That is, in the present embodiment, the mainboard 04 is fixed in the cavity 30 of the reel 03 through the first fixing recess 34 and the second fixing recess 34. Moreover, the angle between the plane of the mainboard 04 and the first surface 31 is greater than or equal to 90° indicates that an angle between the connection area ZZ connected to the mainboard 04 and the element area YY fixed to the first surface 31 is greater than or equal to 90°. In this way, the bending stress between the connection area ZZ and the element area YY is reduced, thereby protecting wirings in a bending region between the connection area ZZ and the element area YY from being influenced by excessive bending stress.

Figure 5:
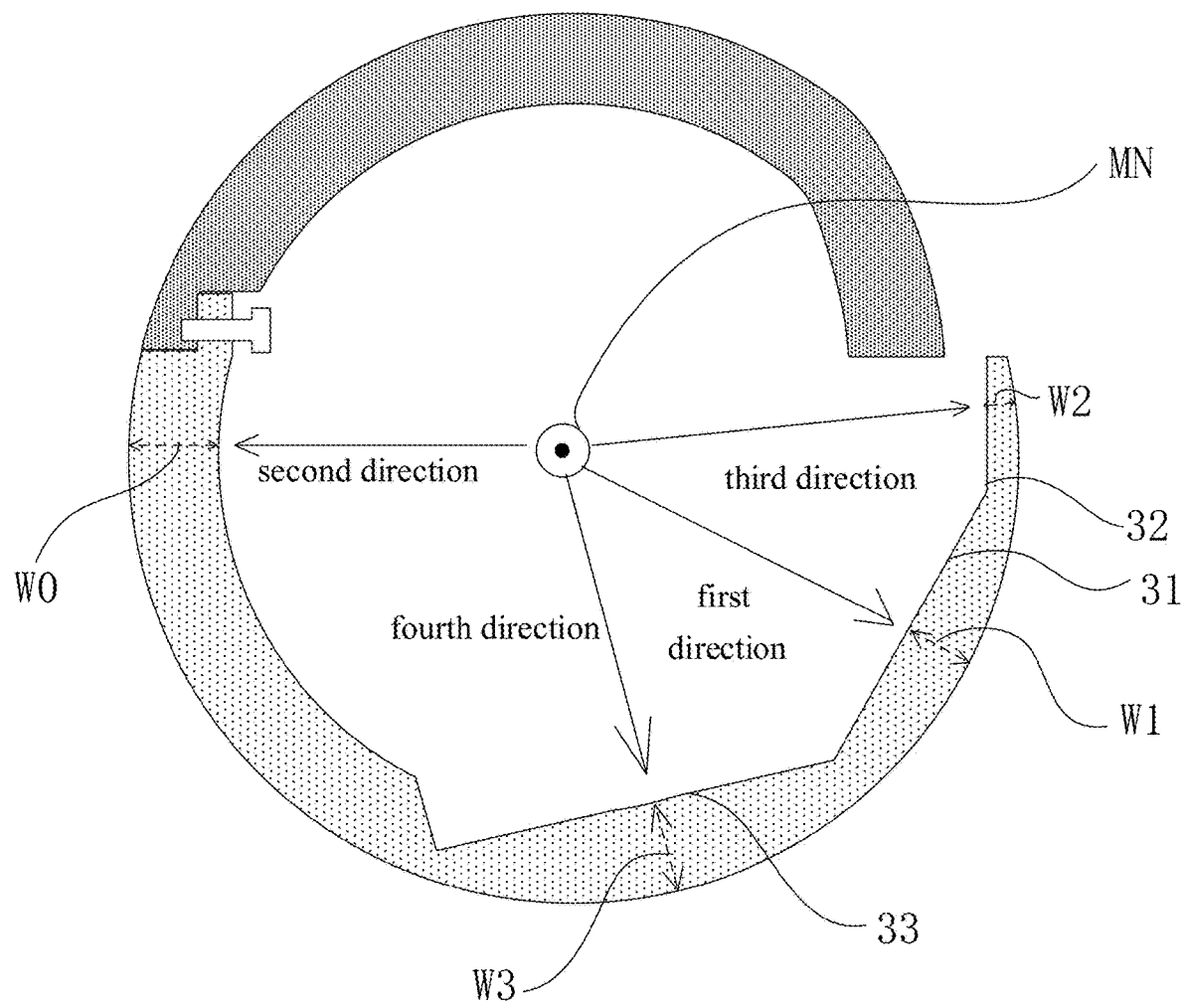
FIG. 5 is a schematic diagram of a reel provided in an embodiment of the present disclosure.

FIG. 5 is a schematic diagram of a reel provided in an embodiment of the present disclosure. As shown in FIG. 5, the reel 03 has an axis MN, and the axis MN is a center line of the reel 03. Since a part of the inner surface of the reel 03 has a design of flat structure, the axis MN of the reel, i.e., the center line of the reel 03 can be determined with reference to the outer surface of the reel 03. A thickness W1 along a first direction at a position of the first surface 31 and a thickness W2 along a third direction at a position of the second surface 32 are smaller than a thickness W0 along the second direction at other positions of the reel 03. When the reel 03 further includes the third surface, a thickness W3 along a fourth direction at a position of the third surface 33, the thickness W1 along the first direction at the position of the first surface 31, and the thickness W2 along the third direction at the position of the second surface 32 are all smaller than a thickness W0 along the second direction at the other positions of the reel 03. The first direction is a direction perpendicular to the axis MN and perpendicular to the first surface 31, the second direction is a direction perpendicular to the axis MN and different from the first direction, the third direction is a direction perpendicular to the axis MN and perpendicular to the second surface 32, and the fourth direction is a direction perpendicular to the axis MN and perpendicular to the third surface 33. Although the thicknesses at the respective positions of the first surface 31 and the second surface 32 are different, a portion corresponding to the first surface 31 and a portion corresponding to the second surface 32 of the reel 03 can be formed into one piece.

Figure 6:
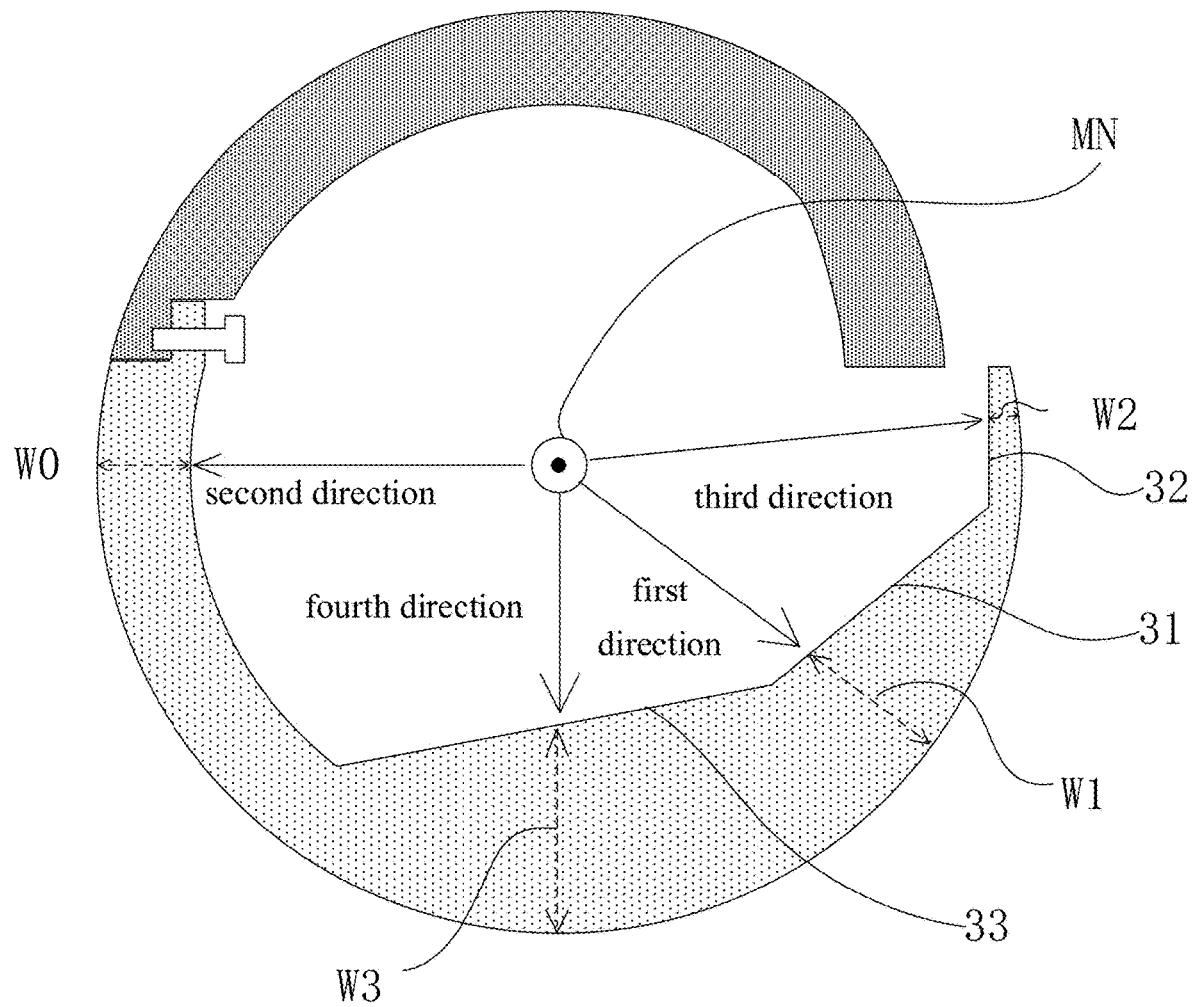
FIG. 6 is a schematic diagram of a reel provided in another embodiment of the present disclosure.

FIG. 6 is a schematic diagram of a reel provided in another embodiment of the present disclosure. As shown in FIG. 6, the thickness W1 along the first direction at the position of the first surface 31 is greater than the thickness W0 in the second direction at the other positions of the reel 03. When the reel 03 further includes the third surface, the thickness W3 along the fourth direction at the position of the third surface 33 and the thickness W1 along the first direction at the position of the first surface 31 are both greater than the thickness W0 in the second direction at the other positions of the reel 03. Although the thickness at the position of the first surface 31 is greater than the thickness at the other positions of the reel 03, the portion corresponding to the first surface 31 and at least another portion of the reel 03 can be formed into one piece. It should be noted that the thickness W2 along the third direction at the position of the second surface 32 is smaller than the thickness W0 along the first direction at the other positions in the reel 03. The first direction is a direction perpendicular to the axis MN and perpendicular to the first surface 31, the second direction is a direction perpendicular to the axis MN and different from the first direction, the third direction is a direction perpendicular to the axis MN and perpendicular to the second surface 32, and the fourth direction is a direction perpendicular to the axis MN and perpendicular to the third surface 33.

Figure 7:
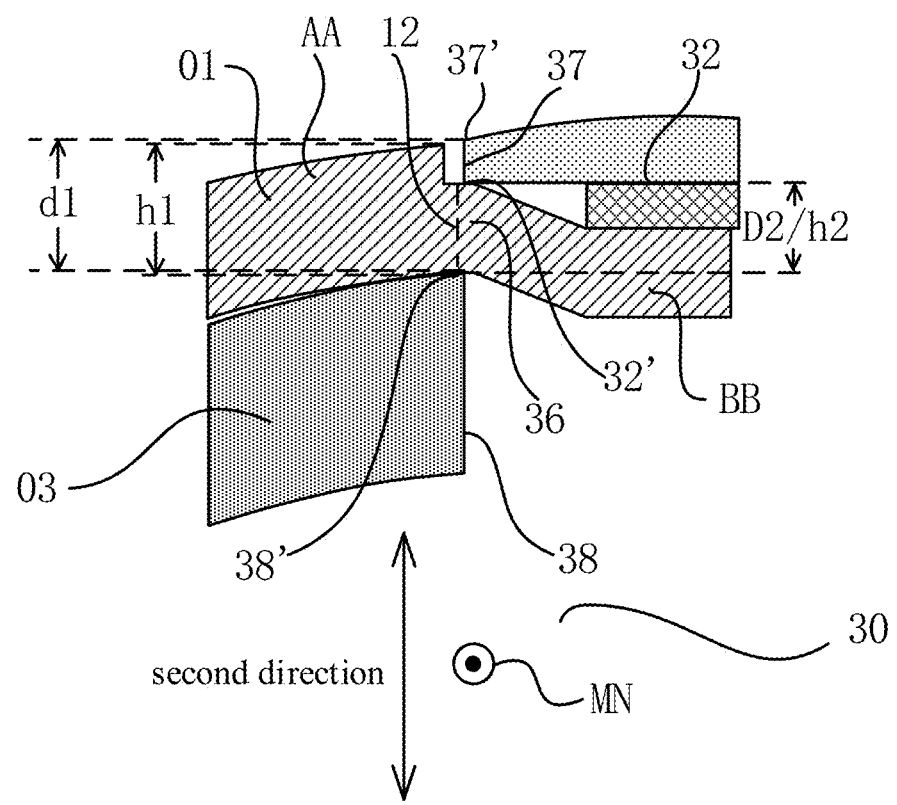
FIG. 7 is a partial enlarged diagram of a slit region provided in an embodiment of the present disclosure.

FIG. 7 is a partial enlarged diagram of a slit region provided in an embodiment of the present disclosure. With reference to FIG. 2 and FIG. 4, the flexible display device provided in the present embodiment includes a slit region LL. In order to clearly illustrate the design of the slit region LL, FIG. 7 illustrates the slit region LL in an enlarged diagram.

As shown in FIG. 7, the reel 03 includes a slit 36, a first end 37, and a second end 38. The first end 37 and the second end 38 are located on two sides of the slit 36, and the first end 37 is farther from the cavity 30 of the reel 03 than the second end 38. The display area AA of the flexible display panel 01 is located outside the reel 03, the second binding area BB of the flexible display panel 01 is located in the cavity 30 of the reel 03, and the display area AA and the second binding area BB of the flexible display panel 01 belong to an entirety of the flexible display panel 01, such that the slit 36 is designed to connect the two parts located inside and outside the reel 03. Moreover, the slit 36 is formed by a displacement of a cavity wall of the reel 03 in a thickness direction, and the second binding area BB of the flexible display panel 01 is provided in the slit region LL along an extending direction of the cavity wall. In this way, the second binding area BB of the flexible display panel 01 extends through slit 36 to the display area AA in accordance with a provision direction of the second binding area BB without changing an angle, thereby reducing the stress of the second binding area BB at the slit region LL and reducing risk of wiring breakage at positions of the second binding area BB close to the display area AA.

For example, further referring to FIG. 7, the first end 37 and the second end 38 are provided along a second direction, and the second direction is perpendicular to the axis MN of the reel 03 and different from the first direction. In addition, a part of the outer surface of the reel 03 corresponding to a position of the first end 37 is a first outer surface 37', a part of the outer surface of the reel 03 corresponding to a position of the second end 38 is a second outer surface 38', and the outer surface of the reel 03 is the surface of the reel 03 facing away from the cavity 30. A distance between the first outer surface 37' and the second outer surface 38' is a first distance d1; a thickness h1 of the flexible display panel 01 at the position of the display area AA is equal to the first distance d1. It should be noted that "equal to" means approximately the same, i.e., "equal to each other" within a range of process accuracy or tolerance.

Referring to FIG. 2 and FIG. 4, except for the position of the slit region LL, the outer surface at the other positions of the reel 03 is a smooth curved surface, so that the display area AA of the flexible display panel 01 can be smoothly provided without protrusions even when being rolled in multiple circles at these positions. In the slit region LL of the reel 03, if the thickness h1 of the flexible display panel 01 at the position of the display area AA is smaller than the first distance d1 between the first outer surface 37' and the second outer surface 38', there will be a step difference between the first outer surface 37' and the flexible display panel 01 in the slit region LL; and if the thickness h1 of the flexible display panel 01 at the position of the display area AA is greater than the first distance d1 between the first outer surface 37' and the second outer surface 38', there will be a protrusion in the slit region LL. In these two situations, the flexible display panel 01, which is rolled on the reel 03, may have depressions or protrusions in the slit region LL, and thus the rolling may not be smooth, such that the wirings in the display area AA has a risk of breakage. When the thickness h1 of the flexible display panel 01 at the position of the display area AA is equal to the first distance d1 between the first outer surface 37' and the second outer surface 38', an upper surface of the display area AA of the flexible display panel 01 is the same height as the first outer surface 37' in the slit region LL, thereby avoiding the depressions or protrusions even when the flexible display panel 01 is bent in multiple circles in the slit region LL.

With reference to FIG. 7, the second surface 32 of the reel 03 includes an inner surface 32' of the first end 37 facing towards the cavity 30. That is, the inner surface 32' of the first end 37 is a part of the second surface 32. That is, the second surface 32 is a part of the inner surface of the reel 03 closest to the slit 36.

In an embodiment of the present disclosure, the edge 12 of the second binding area BB of the flexible display panel 01 close to the display area AA is aligned with the first end 37. That is, a boundary between the display area AA and the binding area BB of the flexible display panel 01 is exactly at the position of the first end 37. As the first end 37 is located on the side of the slit 36, the boundary between the display area AA and the binding area BB of the flexible display panel 01 is exactly located within the slit 36.

In an embodiment of the present disclosure, a second distance d2 is a minimum distance between the inner surface 32' of the first end 37 facing towards the cavity 30 of the reel 03 and the second outer surface 38' of the second end 38, and a thickness h2 of the second binding area BB of the flexible display panel 01 close to the side of the display area AA is equal to the second distance d2. Since the thickness h2 of the second binding area BB close to the side of the display area AA is equal to the second distance d2, the thickness of the edge 12 of the second binding area BB of the flexible display panel 01 is equal to the second distance d2.

In the flexible display panel 01, the thickness of the second binding area BB is smaller than the thickness of the display area AA. As shown in FIG. 7, there is a step between the second binding area BB and the display area AA, and thus d2≠d1. In this way, the slit can be filled by the step height as described above. In addition, the second binding area BB usually faces the light emitting surface of the flexible display panel 01, and in order to fill the step, the light emitting surface of the flexible display panel 01 should face away from the reel 03, i.e., the step should face and be close to the first end 30a.

Figure 8:
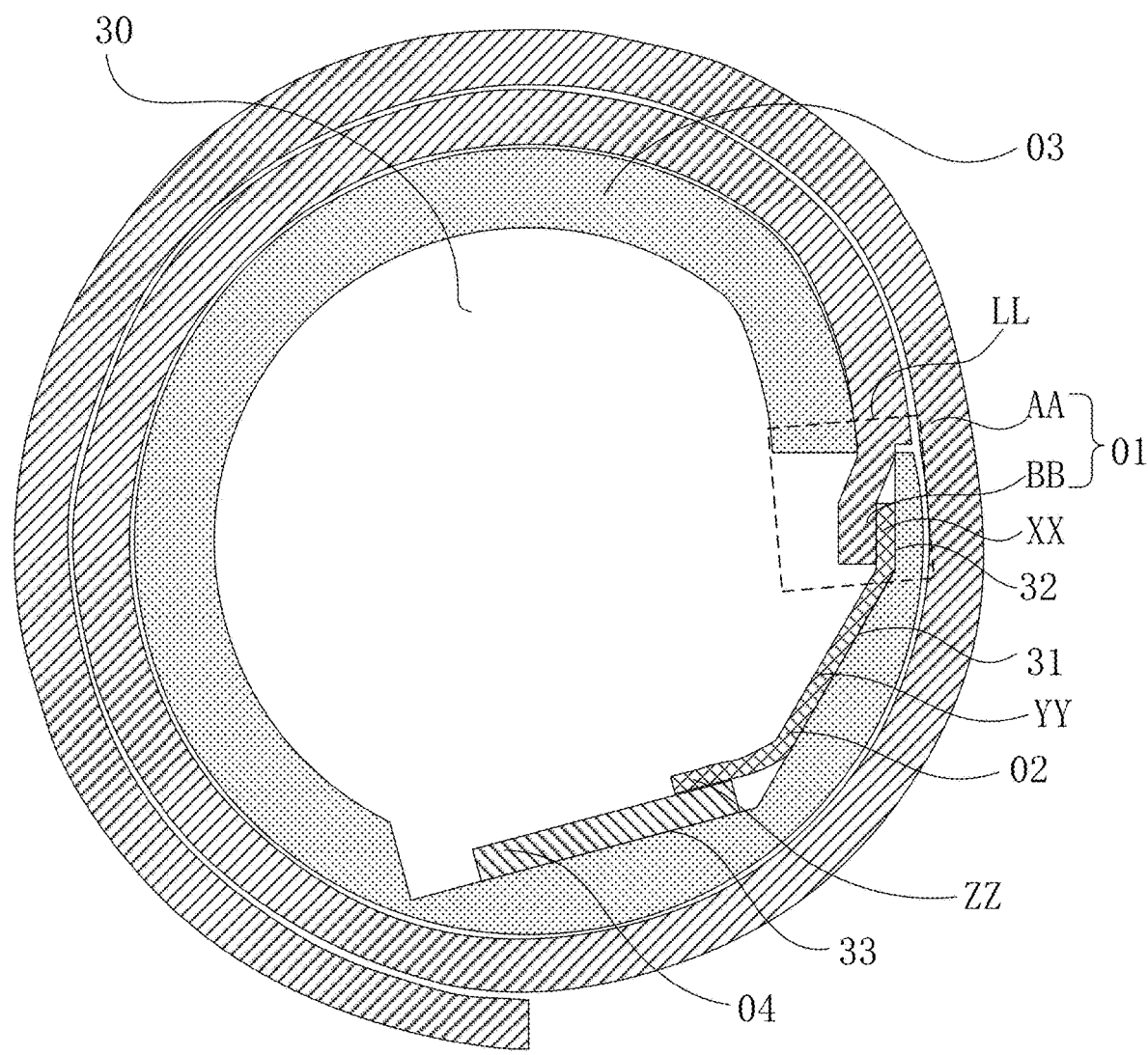
FIG. 8 is a schematic diagram of a rolled flexible display device provided in yet another embodiment of the present disclosure.

FIG. 8 is a schematic diagram of a rolled flexible display device provided in another embodiment of the present disclosure. As shown in FIG. 8, the reel 03 of the flexible display device may be formed in one piece. For example, the reel 03 has a cylindrical shape having open upper and lower bottom surfaces. The flexible printed circuit board 02, the mainboard 04, and the like are placed in the reel 03 through the upper or lower bottom surface of the reel 03, and then the upper and lower bottom surfaces are sealed. In this way, the reel 03 has better sealing and firmness.

In the embodiment as shown in FIG. 2 and FIG. 4, the reel 03 of the flexible display device may also include a first portion 3a and a second portion 3b, and the first portion 3a and the second portion 3b are fixed through a coupling member 3c. The coupling member 3c may be a screw, a fixing pin, an elastic piece, or the like. Since the first portion 3a and the second portion 3b of the reel 03 can be assembled and disassembled, components received in the cavity 30 of the reel 03 can be flexibly replaced and maintained.

In the embodiment shown in FIGS. 2 and 4, the first end 37 of the reel 03 is located at the first portion 3a, and the second end 38 of the reel 03 is located at the second portion 3b. Since the first portion 3a and the second portion 3b of the reel 03 have different structures, it is necessary to provide a slit 36 at a conjunction position of the first portion 3a and the second portion 3b. Therefore, the first end 37 and the second end 38 are respectively designed at the ends of the first portion 3a and the second portion 3b, without additionally providing the slit 36 in one of these two.

In an embodiment of the present disclosure, the first surface 31 and the second surface 32 of the reel 03 are the inner surface corresponding to the first portion 3a. That is, when the reel 03 includes the first portion 3a and the second portion 3b, the first surface 31 and the second surface 32 of the reel are located at a same portion of the reel 03. The element area YY and the first binding area XX of the flexible printed circuit board 02, which are two portions connected to each other, can be fixed to the same portion of the reel 03, and then the reel 03 is assembled into an integral piece. As mentioned above, when the flexible display device further includes the third surface 33, the third surface 33 may also be provided in the same portion of the reel 03 as the first surface 31 and the second surface 32. For example, all three surfaces are located in the first portion 3a.

The above are representative embodiments of the present disclosure, but not intended to limit the present disclosure. Any modifications, equivalents, improvements made within the spirit and principles of the present disclosure shall fall within the scope of the present disclosure. Further, any combination of the above-described elements and all possible variations thereof is encompassed by the present disclosure unless otherwise indicated herein.

What is claimed is:

1. A flexible display device, comprising:
   a flexible display panel;
   a flexible printed circuit board; and
   a reel,
   wherein the flexible printed circuit board comprises a first binding area and an element area,
   an integrated circuit is provided in the element area,
   and a first pad is provided in the first binding area,
   wherein the flexible display panel comprises a display area and a second binding area,
   a second pad is provided in the second binding area,
   and the first pad of the first binding area is bound to the second pad of the second binding area,
   wherein the reel has a cavity,
   and the reel comprises an inner surface facing towards the cavity and an outer surface facing away from the cavity,
   the inner surface comprises a first surface, and the first surface is flat,
   and wherein the element area of the flexible printed circuit board is provided on the first surface,
   and the display area of the flexible display panel is rollable along the outer surface of the reel,
   wherein a mainboard is provided in the cavity of the reel,
   wherein the flexible printed circuit board further comprises a connection area electrically connected to the mainboard,
   wherein the reel further comprises a first fixing recess and a second fixing recess,
   wherein an opening of the first fixing recess and an opening of the second fixing recess both face towards the cavity,
   wherein one end of the mainboard is provided in the first fixing recess,
   and another end of the mainboard is provided in the second fixing recess,
   and wherein an angle between a plane of the mainboard and the first surface is greater than or equal to 90°.

2. The flexible display device according to claim 1, wherein the inner surface of the reel further comprises a second surface, and the second surface is connected to the first surface,
   and wherein the first binding area and the second binding area are provided on the second surface.

3. The flexible display device according to claim 2, wherein the second surface is flat,
   and an angle between the second surface and the first surface is greater than or equal to 90°.

4. The flexible display device according to claim 2, wherein the element area is fixed to the first surface by an adhesive tape,
   and the first binding area is fixed to the second surface by another adhesive tape.

5. The flexible display device according to claim 2, wherein the reel further comprises a slit, and a first end and a second end that are located on two sides of the slit, and wherein the first end is farther from the cavity of the reel than the second end.

6. The flexible display device according to claim 5, wherein the first end and the second end are provided along a second direction,
   and the second direction is perpendicular to an axis of the reel and different from a first direction,
   wherein a first outer surface is a part of the outer surface of the reel corresponding to the first end,
   a second outer surface is part of the outer surface of the reel corresponding to the second end,
   and a distance between the first outer surface and the second outer surface is a first distance,
   and wherein a thickness of the flexible display panel at the display area is equal to the first distance.

7. The flexible display device according to claim 6, wherein the second surface comprises an inner surface of the first end facing towards the cavity.

8. The flexible display device according to claim 7, wherein an edge of the second binding area close to the display area is aligned with the first end.

9. The flexible display device according to claim 7, wherein a minimum distance between the inner surface of the first end facing towards the cavity and the second outer surface is a second distance, and a thickness of the flexible display panel at a side of the second binding area close to the display area is equal to the second distance.

10. The flexible display device according to claim 7, wherein a thickness along a third direction at a position of the second surface of the reel is smaller than a thickness along a first direction at other positions of the reel,
    the first direction is perpendicular to the axis of the reel and perpendicular to the first surface,
    and the third direction is perpendicular to the axis of the reel and perpendicular to the second surface.

11. The flexible display device according to claim 5, wherein the reel comprises a first portion and a second portion,
    and wherein the first portion and the second portion are fixed by a coupling member.

12. The flexible display device according to claim 11, wherein the first end is located in the first portion, and the second end is located in the second portion.

13. The flexible display device according to claim 11, wherein the first surface and the second surface are parts of the inner surface of the reel corresponding to the first portion.

14. The flexible display device according to claim 1, wherein the inner surface of the reel further comprises a third surface connected to the first surface, and the mainboard is provided on the third surface.

15. The flexible display device according to claim 14, wherein the third surface is flat, and an angle between the third surface and the first surface is greater than or equal to 90°.

16. The flexible display device according to claim 14, wherein a thickness along a first direction at a position of the first surface of the reel is greater than a thickness along a second direction at other positions of the reel, the first direction is perpendicular to an axis of the reel and perpendicular to the first surface, and the second direction is perpendicular to the axis of the reel and different from the first direction.

17. The flexible display device according to claim 1, wherein the outer surface of the reel is a curved surface.

18. The flexible display device according to claim 1, wherein a light emitting surface of the display area of the flexible display panel faces away from the reel.

* * * * *